United States Patent
Onaka et al.

(10) Patent No.: US 10,333,572 B2
(45) Date of Patent: Jun. 25, 2019

(54) ANTENNA TUNER CONTROL CIRCUIT, FRONT-END CIRCUIT AND COMMUNICATION DEVICE

(71) Applicant: Murata Manufacturing Co., Ltd., Kyoto (JP)

(72) Inventors: Kengo Onaka, Kyoto (JP); Hidenori Obiya, Kyoto (JP); Katsuhito Kuroda, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/903,383

(22) Filed: Feb. 23, 2018

(65) Prior Publication Data

US 2018/0183478 A1 Jun. 28, 2018

Related U.S. Application Data

(63) Continuation of application No. PCT/JP2016/069219, filed on Jun. 29, 2016.

(30) Foreign Application Priority Data

Aug. 26, 2015 (JP) .................................. 2015-166598

(51) Int. Cl.
*H04B 1/16* (2006.01)
*H04B 1/18* (2006.01)
(Continued)

(52) U.S. Cl.
CPC ................ *H04B 1/18* (2013.01); *H04B 1/04* (2013.01); *H04B 1/0458* (2013.01); *H04B 1/40* (2013.01); *H03H 7/40* (2013.01)

(58) Field of Classification Search
CPC .................................... H04B 1/18; H04B 1/04
See application file for complete search history.

(56) References Cited

U.S. PATENT DOCUMENTS 6,952,565 B1 10/2005 Takeda et al.
8,804,635 B2 * 8/2014 Kwon .................. H04L 5/0007
370/281

(Continued)

FOREIGN PATENT DOCUMENTS

JP 63-156128 U 10/1988
JP H11-251956 A 9/1999
(Continued)

OTHER PUBLICATIONS

International Search Report for International Application No. PCT/JP2016/069219 dated Aug. 9, 2016.
(Continued)

*Primary Examiner* — Tuan H Nguyen
(74) *Attorney, Agent, or Firm* — Pearne & Gordon LLP

(57) ABSTRACT

There are provided an antenna, an antenna tuner configured to adjust frequency characteristics of the antenna, and a control circuit configured to change frequency characteristics of the antenna tuner in a boundary time set for a unit of time of communication. For example, after matching indicators based on VSWRs and received signal strength indicators based on RSSIs have been acquired in a plurality of times of communication space time, the antenna tuner is put into an optimum mode. This suppresses the decrease in communication throughput caused by the adjustment of the antenna tuner and suppresses the interruption of communication at the time of adjustment of the antenna tuner.

14 Claims, 5 Drawing Sheets

(51) Int. Cl.
  *H04B 1/04* (2006.01)
  *H04B 1/40* (2015.01)
  *H03H 7/40* (2006.01)

(56) References Cited

U.S. PATENT DOCUMENTS

| | | | |
|---|---|---|---|
| 2005/0227640 A1 | 10/2005 | Haque et al. | |
| 2012/0206556 A1* | 8/2012 | Yu .......................... | H04M 1/00 |
| | | | 348/14.02 |
| 2014/0177686 A1* | 6/2014 | Greene ................... | H04B 1/18 |
| | | | 375/219 |

FOREIGN PATENT DOCUMENTS

| | | |
|---|---|---|
| JP | 2007-166534 A | 6/2007 |
| JP | 2007-531470 A | 11/2007 |
| JP | 2008-011341 A | 1/2008 |
| JP | 2013-070143 A | 4/2013 |
| WO | 01/028113 A1 | 4/2001 |

OTHER PUBLICATIONS

Written Opinion for International Application No. PCT/JP2016/069219 dated Aug. 9, 2016.

* cited by examiner

ANTENNA TUNER CONTROL CIRCUIT, FRONT-END CIRCUIT AND COMMUNICATION DEVICE

This is a continuation of International Application No. PCT/JP2016/069219 filed on Jun. 29, 2016 which claims priority from Japanese Patent Application No. 2015-166598 filed on Aug. 26, 2015. The contents of these applications are incorporated herein by reference in their entireties.

BACKGROUND

Technical Field

The present disclosure relates to an antenna tuner control circuit for controlling an antenna tuner that is connected to an antenna to adjust antenna characteristics, a front-end circuit including the antenna tuner, and a communication apparatus including the antenna tuner.

In order to perform impedance matching between a feeding circuit and an antenna or allow a small antenna to have predetermined antenna characteristics in a wide band, an antenna tuner is connected to the antenna.

For example, Patent Document 1 discloses a matching circuit that optimizes a matching state by applying a voltage to a variable capacitive matching circuit (antenna tuner) to maximize the electric field strength of a signal received from an antenna. Patent Document 2 discloses a radio terminal configured to apply a voltage to a variable capacitive element included in a receiving-side variable matching circuit (antenna tuner) to maximize the electric field strength (RSSI) of a signal received from an antenna. Patent Document 3 discloses a circuit configuration with which a variable matching circuit (antenna tuner) is adjusted to realize optimum matching conditions on the basis of values obtained by two power detectors, a power detector for detecting power of a traveling wave and a power detector for detecting power of a reflected wave, disposed between an antenna and a transmission amplifier. Patent Document 4 discloses a circuit configuration with which a variable matching circuit (antenna tuner) is controlled to minimize the value of a reflected wave level (corresponding to VSWR) detected at the time of transmission and maximize the value of an output (corresponding to RSSI) of a detector circuit detected at the time of reception.

Patent Document 1: Japanese Unexamined Utility Model Registration Application Publication No. 63-156128
Patent Document 2: Japanese Unexamined Patent Application Publication No. 2008-11341
Patent Document 3: Japanese Unexamined Patent Application Publication (Translation of PCT Application) No. 2007-531470
Patent Document 4: Japanese Unexamined Patent Application Publication No. 11-215956

BRIEF SUMMARY

The antenna tuners disclosed in Patent Documents 1 to 4 select one of a plurality of states (modes) of a variable matching circuit which provides the best indicator (RSSI, VSWR, or the like) on the basis of a result of monitoring of reception sensitivity (RSSI or a signal strength at a detector circuit) or a result of monitoring of a reflected wave of a transmission wave.

In all of the methods, when the best mode of an antenna tuner is determined, it is necessary to acquire the above-described indicator in each of a plurality of possible modes of the antenna tuner and select one of the modes which provides the best indicator.

However, all of the above-described methods do not describe a timing at which the matching state of an antenna tuner is adjusted. If this timing is bad, a mode with bad conditions may be temporarily selected. In this case, the adjustment of an antenna tuner may cause a significant decrease in throughput. In the worst case, communication may be lost.

The present invention provides an antenna tuner control circuit that suppresses the decrease in communication throughput caused by the adjustment of an antenna tuner and suppresses the interruption of communication at the time of adjustment of the antenna tuner by adjusting the matching state of the antenna tuner at an appropriate timing, a front-end circuit including the antenna tuner control circuit, and a communication apparatus including the antenna tuner control circuit.

(1) An antenna tuner control circuit according to the present disclosure is included in a communication apparatus and is configured to control power to be transmitted from the communication apparatus on the basis of power control information transmitted from a base station. The antenna tuner control circuit includes an antenna configured to receive the power control information, an antenna tuner configured to adjust frequency characteristics of the antenna, and a control circuit configured to change frequency characteristics of the antenna tuner in a boundary time set for a communication symbol.

Since the frequency characteristics (mode) of an antenna tuner is changed in a boundary time set for a unit of time of communication with the above-described configuration, practical communication is not affected by the change.

(2) In the above-described (1), a communication symbol in which the control circuit performs a change in frequency characteristics of the antenna tuner can be a communication symbol included in the power control information. Since antenna tuning is performed in a short period immediately after the receipt of the power control information, the optimization of a matching state of an antenna can be rapidly performed.

(3) In the above-described (1) or (2), a directional coupler connected between the antenna tuner and a feeding circuit can be further included. The control circuit can detect a matching indicator that is a voltage standing wave ratio (of a transmission signal) or a matching indicator based on a voltage standing wave ratio on the basis of a signal output from the directional coupler and not select a setting state in which the matching indicator is the worst. As a result, a serious trouble such as the interruption of communication caused by the adjustment of an antenna tuner can be effectively prevented.

(4) In any one of the above-described (1) to (3), a circuit configured to detect a received signal strength indicator that is a received signal strength (RSSI) or a received signal strength indicator based on a received signal strength (RSSI) can be further included. The control circuit not select a setting state in which the received signal strength indicator is the worst. As a result, a serious trouble such as the interruption of communication caused by the adjustment of an antenna tuner can be effectively prevented.

(5) In the above-described (1) or (2), a circuit configured to detect a received signal strength indicator that is a received signal strength (RSSI) or a received signal strength indicator based on a received signal strength (RSSI) and a directional coupler connected between the antenna tuner and a feeding circuit can be further included. The control circuit can detect a matching indicator that is a voltage standing wave ratio of a transmission signal or a matching indicator based on a voltage standing wave ratio on the basis of a signal output from the directional coupler and can select a state of the antenna tuner in which an overall rating using the matching indicator and the received signal strength indicator is the best. As a result, the frequency characteristics of an antenna can be improved in both a transmission band and a reception band.

(6) In the above-described (3) or (5), the control circuit can acquire the matching indicators in a plurality of setting states of frequency characteristics of the antenna tuner in a plurality of times of the boundary time. Since the detection of matching indicators in a plurality of setting states of an antenna tuner is dispersedly performed, indicators in a plurality of setting states of frequency characteristics of the antenna tuner can be acquired in spite of the fact that a single boundary time is limited.

(7) In the above-described (4) or (5), the control circuit can acquire the received signal strength indicators in a plurality of setting states of frequency characteristics of the antenna tuner in a plurality of times of the boundary time. Since the detection of reception signal strength indicators in a plurality of setting states of an antenna tuner is dispersedly performed, indicators in a plurality of setting states of frequency characteristics of the antenna tuner can be acquired in spite of the fact that a single boundary time is limited.

(8) In the above-described (6) or (7), the control circuit can set a state of the antenna tuner in a boundary time subsequent to the plurality of times of the boundary time. Since not only the detection of matching indicators or reception signal strength indicators in a plurality of setting states of an antenna tuner but also the setting of a state of the antenna tuner performed on the basis of the detected indicators are dispersedly performed, the setting of a state of the antenna tuner can be performed in a limited boundary time.

(9) A front-end circuit according to the present disclosure includes the antenna tuner according to any one of (1) to (8) and a high-frequency circuit connected to the antenna tuner.

Since a front-end circuit can be configured as a single component with the above-described configuration, the number of components can be reduced.

(10) A communication apparatus according to the present disclosure includes the antenna tuner control circuit according to any one of (1) to (8) and a Base Band Integrated Circuit. As a result, there can be provided a communication apparatus that suppresses the decrease in communication throughput and the interruption of communication which are caused by the adjustment of an antenna tuner.

According to the present disclosure, there can be provided an antenna tuner control circuit that suppresses the decrease in communication throughput caused by the adjustment of an antenna tuner and suppresses the interruption of communication at the time of adjustment of the antenna tuner, a front-end circuit including the antenna tuner control circuit, and a communication apparatus including the antenna tuner control circuit.

DETAILED DESCRIPTION

Figure 1:
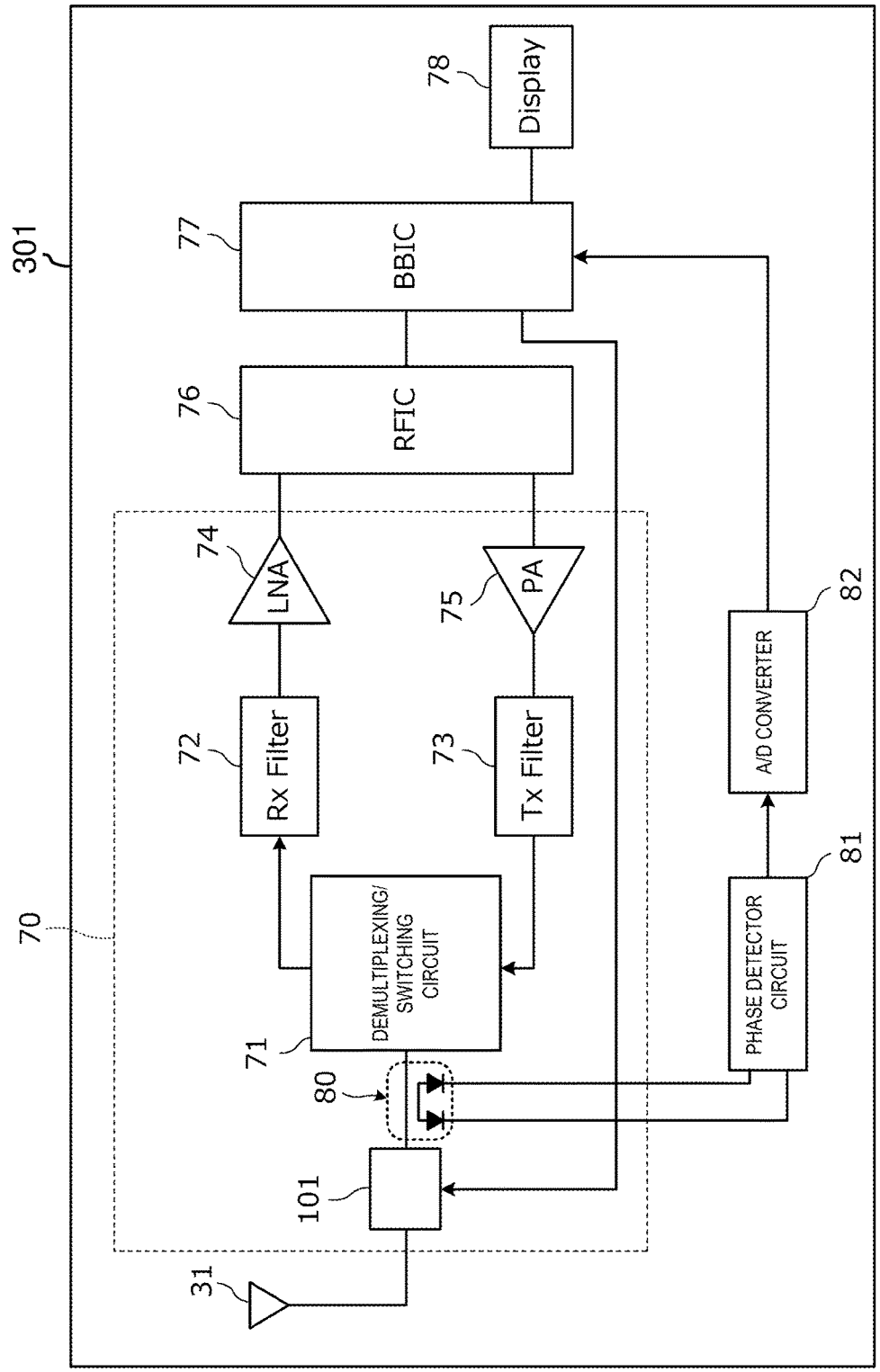
FIG. 1 is a block diagram of a communication apparatus 301 according to an embodiment of the present disclosure.

FIG. 1 is a block diagram of a communication apparatus 301 according to an embodiment of the present disclosure. The communication apparatus 301 is, for example, a cellular phone terminal. An antenna tuner 101 is connected to an antenna 31. Between the antenna tuner 101 and a demultiplexing/switching circuit 71, a coupler 80 is provided.

Between the demultiplexing/switching circuit 71 and a reception signal port of a radio frequency integrated circuit (RFIC) 76, a reception (Rx) filter 72 and a low-noise amplifier (LNA) 74 are provided. Between a transmission signal port of the RFIC 76 and the demultiplexing/switching circuit 71, a power amplifier (PA) 75 and a transmission (Tx) filter 73 are provided.

The RFIC 76 and a display apparatus (display) 78 are connected to a base band integrated circuit (BBIC) 77. The antenna tuner 101, the coupler 80, the demultiplexing/switching circuit 71, the Rx filter 72, the Tx filter 73, the LNA 74, and the PA 75 are configured as a single front-end circuit 70 (a single module component).

A phase detector circuit 81 is connected to the coupler 80. The phase detector circuit 81 is a circuit for detecting two powers, the power of a traveling wave of a transmission signal and the power of a reflected wave of a transmission signal. An analog-to-digital (A/D) converter 82 converts a voltage detected by the phase detector circuit 81 into a digital value.

The RFIC 76 performs the modulation of a transmission signal and the detection and demodulation of a received signal, and also performs the detection of a received signal strength (RSSI).

The BBIC 77 reads a value converted by the A/D converter 82 and acquires a matching indicator based on a voltage standing wave ratio (VSWR). The BBIC 77 also acquires a received signal strength indicator on the basis of a received signal strength indicator (RSSI) detected by the RFIC 76.

The antenna tuner 101 includes, for example, a variable reactance element connected in series to a signal transmission path and a variable reactance element connected in shunt with a signal transmission path. The BBIC 77 sets one of a plurality of modes by switching the value of the variable reactance element in the antenna tuner 101 in a plurality of stages.

An operation according to this embodiment in a communication system including the communication apparatus 301 and a base station will be described.

A base station performs power control upon the communication apparatus 301 in accordance with, for example, the distance between the base station and the communication apparatus 301 so as to improve the efficiency of communication between the base station and the communication apparatus 301. Information about the power control (power control information) is included in downlink (DL) information transmitted from the base station to the communication apparatus 301.

The BBIC 77 receives the power control information from the base station via, for example, the antenna 31. The BBIC 77 controls the RFIC 76 on the basis of the power control information to control power to be transmitted from the PA 75.

As will be described below, the BBIC 77 that has received the power control information performs a process for adjusting the antenna tuner 101 using the time of a guard interval CP (boundary time).

There is a plurality of possible modes in the antenna tuner 101. The BBIC 77 selects one of these modes in which the matching state of an antenna becomes optimum. Specifically, first, antenna matching states in respective modes of an antenna tuner are sequentially checked. One of these modes in which the matching state of the antenna becomes optimum is determined, and the antenna tuner is set to the determined mode.

The guard interval CP is set to remove a symbol interference such as a multipath in which delayed waves of the previous symbol interfere with the following symbol and an interference between subcarriers caused by collapsed orthogonality between subcarriers. The guard interval CP is, for example, 4.7 μs for short and 16.7 μs for long.

The coupler 80 detects a transmission wave and a receiving wave. The phase detector circuit 81 detects the phase of a signal output from the coupler 80. The A/D converter converts a voltage output from the phase detector circuit 81 into a digital value. The BBIC 77 reads a value output from the A/D converter to detect (monitor) a voltage standing wave ratio (VSWR) between the antenna tuner 101 and the demultiplexing/switching circuit 71 and a received signal strength indicator (RSSI).

As will be described below, the BBIC 77 determines the optimum mode of an antenna tuner on the basis of the voltage standing wave ratio (VSWR) and the received signal strength indicator (RSSI) and puts the antenna tuner 101 into the determined mode.

Since the above-described mode switching of the antenna tuner 101 is performed in the guard interval CP, an antenna tuner can be adjusted at a timing at which practical communication is less susceptible to the adjustment. The influence of the change in antenna matching can therefore be minimized.

Figure 2:
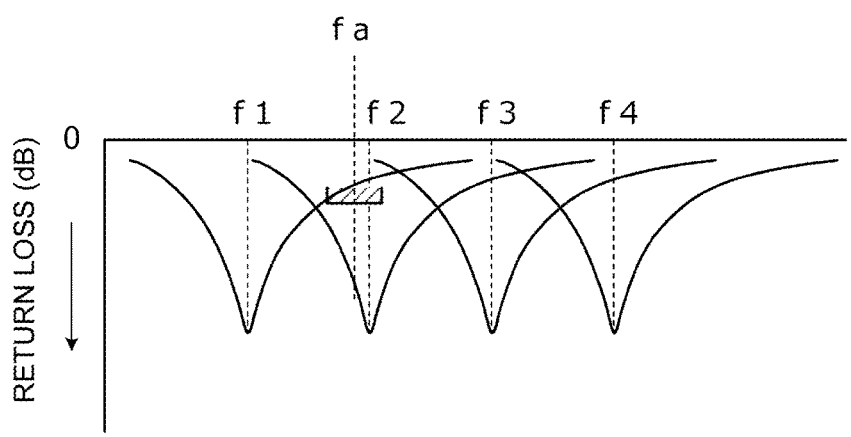
FIG. 2 is a diagram illustrating the return loss characteristics of an antenna in each mode of an antenna tuner 101.

FIG. 2 is a diagram illustrating the return loss characteristics of an antenna in each mode of the antenna tuner 101. In this example, when the value of the above-described variable reactance element is switched in a plurality of stages, one of four modes (Mode 1, Mode 2, Mode 3, and Mode 4 in this order) having respective resonance frequencies f1, f2, f3, and f4 is selected. For example, if a necessary return loss in a predetermined band having a center frequency fa is as represented by a hatched portion in FIG. 2, the best matching indicator or the best received signal strength indicator can be obtained when the mode of an antenna tuner is set such that the resonant frequency of an antenna is f2. If there is no factor concerning communication other than the resonant frequency of an antenna, a better matching indicator or a better received signal strength indicator is obtained in the order of Mode 2, Mode 1, Mode 3, and Mode 4.

Figure 3:
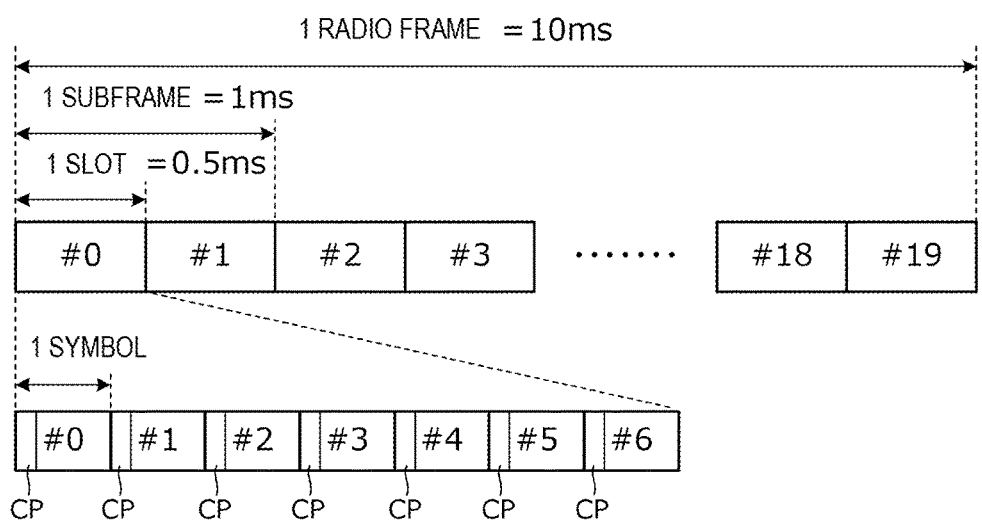
FIG. 3 is a diagram illustrating the format of a radio frame in Long Term Evolution (LTE).

FIG. 3 is a diagram illustrating the format of a radio frame in Long Term Evolution (LTE). A radio frame has a length of 10 ms and includes 10 subframes having the length of 1 ms. Each subframe includes two slots having the length of 0.5 ms. Each slot includes 7 symbols. Effective data is stored in each symbol. The above-described guard interval CP is provided at the beginning of each symbol. A guard interval is therefore sandwiched between boundary times of adjacent symbols. The above-described power control information is stored in a radio frame as a piece of information.

The actual value of a switching time of CMOS_Switch provided in an antenna tuner is usually less than or equal to 5 μs. It is sometimes difficult (impossible) to switch an antenna tuner between all modes and monitor a VSWR or an RSSI within the time of a guard interval CP (a boundary time). In this embodiment, a single or small number of modes are subjected to switching and monitoring in the guard interval CP. Subsequently, an antenna tuner is set back to the original mode. In the next guard interval CP, the remaining modes that have yet to be monitored in the previous guard interval CP are subjected to switching and the monitoring of a VSWR or an RSSI.

By repeating this process, the monitoring of a VSWR or an RSSI is performed in all modes of an antenna tuner. In the case of frequency division duplex (FDD), a frequency band is divided for transmission use and reception use. The monitoring of both a VSWR in a transmission wave and an RSSI in a receiving wave therefore increases the probability that that best mode of an antenna tuner will be selected.

Next, details of a process performed by the BBIC 77 illustrated in FIG. 1 will be described with reference to some flowcharts.

Figure 4:
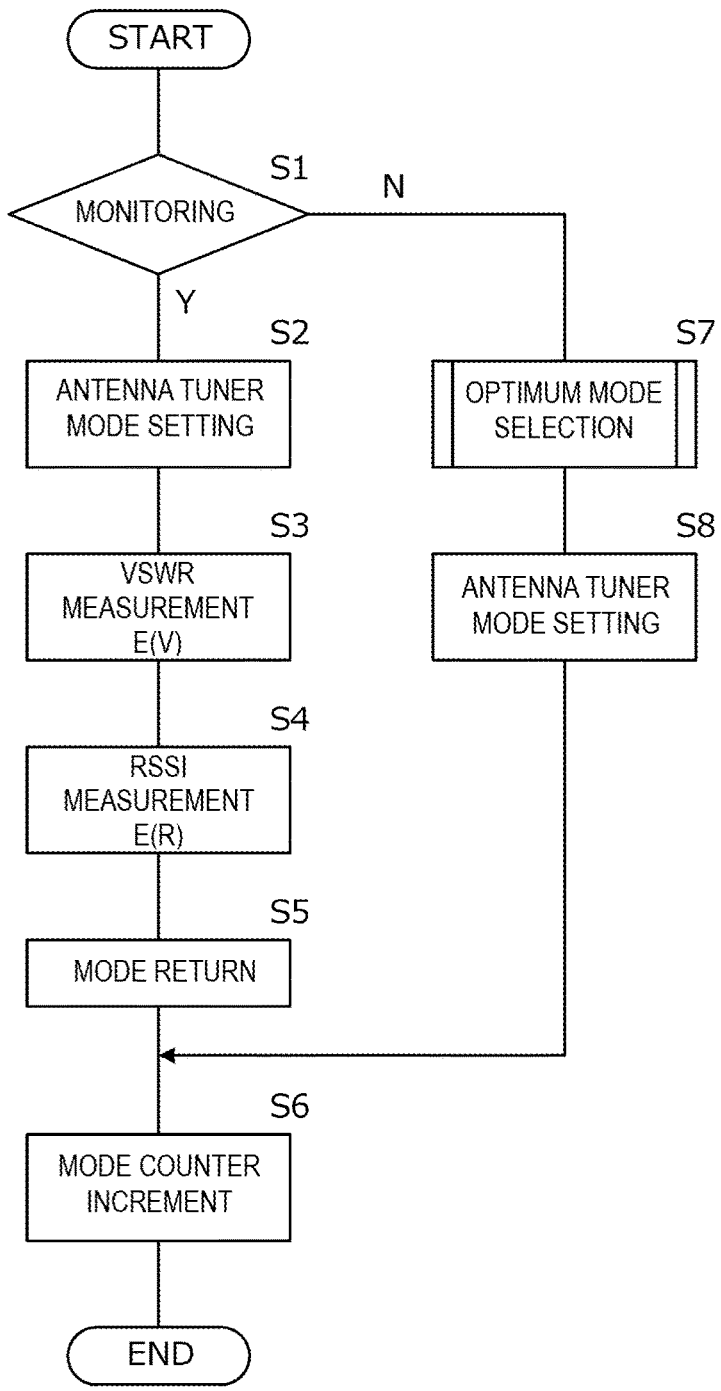
FIG. 4 is a flowchart illustrating a process performed for each symbol in a BBIC 77.

FIG. 4 is a flowchart illustrating a process performed for each symbol. First, it is determined whether this process is in a stage where the characteristics of the antenna tuner 101 are monitored (S1). This determination is performed on the basis of the value of a mode counter to be described below. A mode counter is a quinary counter, and the value of the mode counter is cyclically changed in the order of 0→1→2→3→4→0→1→ . . . . In a case where the value of the mode counter is one of 1 to 4, the process is determined to be in a monitoring stage. In a case where the value of the mode counter is 0, the process is determined to be in an optimum mode setting stage.

In a case where the value of the mode counter is one of 1 to 4, the mode of the antenna tuner 101 is set to a mode corresponding to the value of the mode counter (S2). This mode is a mode determined on the basis of the value of a mode counter determined in step S6 in the last monitoring stage. A voltage standing wave ratio (VSWR) in this mode is measured and an indicator (matching indicator) E(V) is acquired (S3). In addition, a received signal strength indicator (RSSI) in this mode is measured and an indicator (received signal strength indicator) E(R) is acquired (S4). Subsequently, the antenna tuner is returned to a mode set before the switching in step S2 (S5). The mode counter is incremented for mode setting in the next monitoring stage (S6).

The process is performed for each symbol illustrated in FIG. 4. The value of the mode counter is therefore cyclically changed in the order of 0→1→2→3→4→0→1→ . . . for each symbol.

In a case where the value of the mode counter is 0, the process is determined to be in an optimum mode setting stage. In a case where the value of the mode counter is 0, an optimum mode selection process to be described below is performed (S1→S7). Subsequently, a selected optimum mode is set for the antenna tuner (S8).

Figure 5:
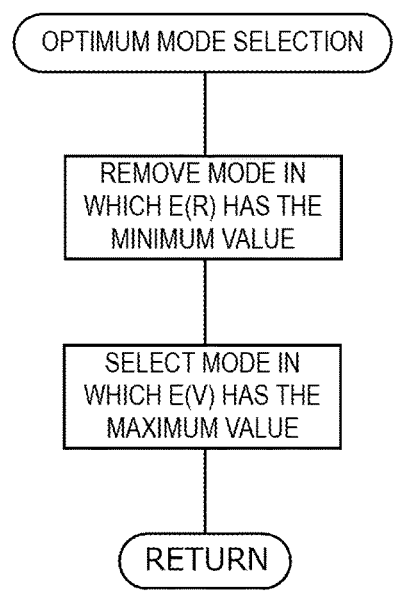
FIG. 5 is a flowchart illustrating an optimum mode selection process and a mode setting process performed for an antenna tuner.
Figure 6:
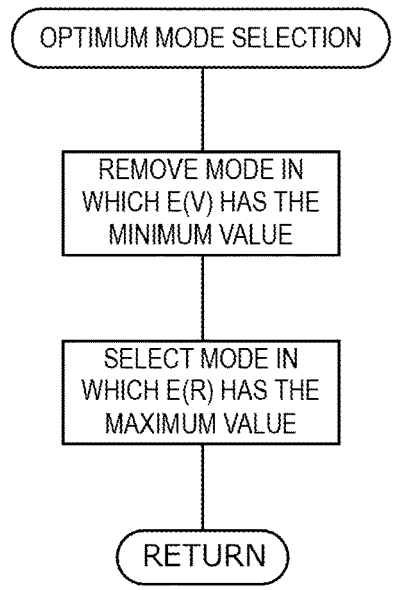
FIG. 6 is a flowchart illustrating another optimum mode selection process and another mode setting process performed for an antenna tuner.
Figure 7:
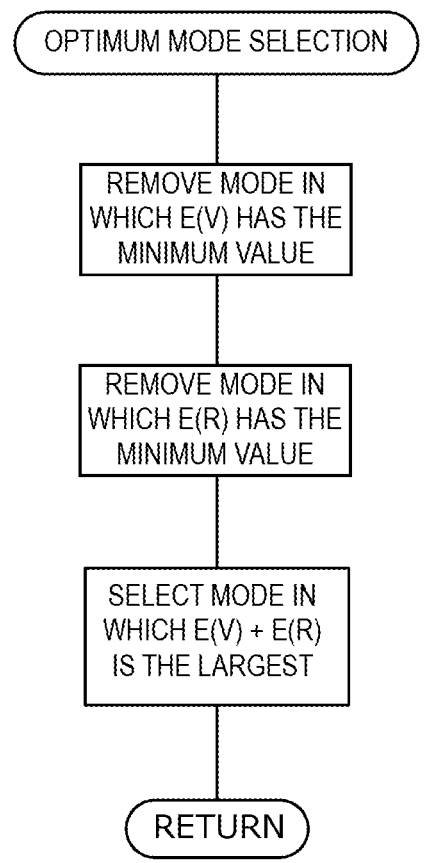
FIG. 7 is a flowchart illustrating a still another optimum mode selection process and a still another mode setting process performed for an antenna tuner.

In step S7, the optimum mode is selected on the basis of matching indicators E(V) and received signal strength indicators E(R) in four modes which have already been acquired. FIGS. 5 to 7 are diagrams illustrating examples of this optimum mode selection process.

In the example illustrated in FIG. 5, one of the four modes in which the received signal strength indicator E(R) has the minimum value is removed, and one of the remaining three modes in which the matching indicator E(V) is the largest is set as an optimum mode. In this process, a mode in which the matching indicator E(V) is high but the received signal strength indicator E(R) is the worst is not selected. A serious trouble such as the interruption of communication or a significant decrease in throughput can therefore be effectively prevented.

In the example illustrated in FIG. 6, one of the four modes in which the matching indicator E(V) has the minimum value is removed, and one of the remaining three modes in which the received signal strength indicator E(R) is the largest is set as an optimum mode. In this process, a mode in which the received signal strength indicator E(R) is high but the matching indicator E(V) is the worst is not selected. A serious trouble such as the interruption of communication or a significant decrease in throughput can therefore be effectively prevented.

In the example illustrated in FIG. 7, one of the four modes in which the matching indicator E(V) has the minimum value is removed, one of the four modes in which the received signal strength indicator E(R) has the minimum value is removed, and one of a plurality of remaining modes in which a value obtained by adding the matching indicator E(V) and the received signal strength indicator E(R) (an overall rating using the matching indicator and the received signal strength indicator) is the largest is set as an optimum mode. With this process, the frequency characteristics of an antenna can be improved in both a transmission band and a reception band.

In the example illustrated in FIG. 4, in each guard interval CP for a single symbol, the matching indicator E(V) and the received signal strength indicator E(R) in one of a plurality of modes of an antenna tuner are acquired. However, in a single guard interval CP, the switching and monitoring of a plurality of modes may be performed. For example, in a case where a guard interval is short, the switching and monitoring of a plurality of modes may be performed using a plurality of guard intervals. In a case where a guard interval is long, the switching and monitoring of a plurality of modes may be performed in a single guard interval.

In the example illustrated in FIG. 4, the matching indicator E(V) and the received signal strength indicator E(R) in each mode of an antenna tuner are acquired. After that, in another guard interval CP, the selection and setting of an optimum mode are performed. However, in the guard interval CP in which the acquisition of the matching indicators E(V) and the received signal strength indicators E(R) in all modes is completed, the selection and setting of an optimum mode may be performed.

In the example illustrated in FIG. 4, both the matching indicator E(V) and the received signal strength indicator E(R) are acquired. However, only the matching indicator E(V) may be acquired to select an optimum mode. Alternatively, even in a case where both the matching indicator E(V) and the received signal strength indicator E(R) are measured, only the matching indicator E(V) may be used to select an optimum mode. This reduces the probability of being affected by noise and distortion. That is, since the received signal strength indicator (RSSI) is increased under the influence of noise and distortion, a situation where reception sensitivity is degraded can be prevented by not referring to the received signal strength indicator (RSSI).

The descriptions of the embodiments are merely illustrative in all respects and are not limiting. It is obvious to those skilled in the art that variations and modifications can be made as appropriate. For example, configurations described in the different embodiments can be partly replaced or combined. The scope of the present invention is determined in view of the appended claims. Furthermore, equivalents to the appended claims and all modifications of the present invention which fall within the scope of the present invention are intended to be encompassed in the scope of the present invention.

REFERENCE SIGNS LIST 31 antenna
71 demultiplexing/switching circuit
72 Rx Filter
73 Tx Filter
74 LNA
75 PA
76 RFIC
77 BBIC
78 display apparatus
80 coupler
81 phase detector circuit
82 A/D converter
101 antenna tuner
301 communication apparatus

The invention claimed is:

1. An antenna tuner control circuit comprising:
an antenna configured to receive power control information;
an antenna tuner configured to adjust frequency characteristics of the antenna; and
a control circuit configured to change frequency characteristics of the antenna tuner using a time of a guard interval provided at a beginning of each communication symbol of a slot of a subframe,
wherein the antenna tuner control circuit is included in a communication apparatus and is configured to control power transmitted from the communication apparatus based on the power control information, the power control information being transmitted from a base station.

2. The antenna tuner control circuit according to claim 1, wherein the communication symbol for which the control circuit changes frequency characteristics of the antenna tuner is a communication symbol included in the power control information.

3. The antenna tuner control circuit according to claim 1, further comprising a directional coupler connected between the antenna tuner and a feeding circuit,
wherein the control circuit is further configured to detect a matching indicator that is a voltage standing wave ratio or is based on a voltage standing wave ratio, based on a signal output from the directional coupler, and the control circuit is further configured to prevent selecting a setting state in which the matching indicator is the worst.

4. The antenna tuner control circuit according to claim 3, wherein the control circuit is further configured to acquire the matching indicator in a plurality of setting states of frequency characteristics of the antenna tuner in a plurality of boundary times.

5. The antenna tuner control circuit according to claim 4, wherein the control circuit is further configured to set a state of the antenna tuner in a boundary time subsequent to the plurality of boundary times.

6. The antenna tuner control circuit according to claim 1, further comprising a circuit configured to detect a received signal strength or a received signal strength indicator based on a received signal strength,
wherein the control circuit is further configured to prevent selecting a setting state in which the received signal strength or received signal strength indicator is the worst.

7. The antenna tuner control circuit according to claim 6, wherein the control circuit is further configured to acquire the received signal strength indicator in a plurality of setting states of frequency characteristics of the antenna tuner in a plurality of boundary times.

8. The antenna tuner control circuit according to claim 7, wherein the control circuit is further configured to set a state of the antenna tuner in a boundary time subsequent to the plurality of boundary times.

9. The antenna tuner control circuit according to claim 1, further comprising,
a circuit configured to detect a received signal strength or a received signal strength indicator based on a received signal strength, and
a directional coupler connected between the antenna tuner and a feeding circuit,
wherein the control circuit is further configured to detect a matching indicator that is a voltage standing wave ratio or is based on a voltage standing wave ratio, based on a signal output from the directional coupler, and the control circuit is further configured to select a state of the antenna tuner in which an overall rating, determined based on the matching indicator and the received signal strength or received signal strength indicator, is the best.

10. The antenna tuner control circuit according to claim 9, wherein the control circuit is further configured to acquire the matching indicator in a plurality of setting states of frequency characteristics of the antenna tuner in a plurality of boundary times.

11. The antenna tuner control circuit according to claim 9, wherein the control circuit is further configured to acquire the received signal strength indicator in a plurality of setting states of frequency characteristics of the antenna tuner in a plurality of boundary times.

12. A front-end circuit comprising:
an antenna tuner control circuit comprising:
an antenna configured to receive power control information;
an antenna tuner configured to adjust frequency characteristics of the antenna; and
a control circuit configured to change frequency characteristics of the antenna tuner using a time of a guard interval provided at a beginning of each communication symbol of a slot of a subframe; and
a high-frequency circuit connected to the antenna tuner control circuit.

13. A communication apparatus comprising:
an antenna tuner control circuit comprising:
an antenna configured to receive power control information;
an antenna tuner configured to adjust frequency characteristics of the antenna; and
a control circuit configured to change frequency characteristics of the antenna tuner using a time of a guard interval provided at a beginning of each communication symbol of a slot of a subframe; and
a base band integrated circuit connected to the antenna tuner.

14. The communication apparatus according to claim 13, wherein the antenna tuner control circuit is configured to control power transmitted from the communication apparatus based on the power control information, the power control information being transmitted from a base station.

* * * * *